DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED OCTOBER 3, 1972

903 O.G. 7

T903,017

PHOTOSENSITIVE COMPOSITION AND ELEMENT EMPLOYING COMPLEXES OF CYANIDES AND ORGANOAZIDES AND METHOD OF USE

James A. Van Allan, 314 Rye Road, Rochester, N.Y. 14615, and Shirley C. Chang, 64 Elaine Drive, Henrietta, N.Y. 14467

Filed Nov. 1, 1971, Ser. No. 194,551
Int. Cl. G03c *1/52, 1/92;* G03f *7/08*
U.S. Cl. 96—33
No Drawing. 22 Pages Specification

Photographic compositions including a radiation-sensitive complex of a cyanide of an alkali metal or a triorganophosphonium group with an organoazide such as an arylazide are radiation-sensitive and can be imagewise exposed to activating rays to yield a species that can react with a dye-forming coupler to form an image dye, e.g. an azo dye. Optionally, such compositions can include a polyhalogen sensitizer, a water-permeable polymeric binder and/or a dye-forming coupler. When these compositions are present on a support, photographic elements are formed. Imagewise exposure of the compositions or element to activating rays for the complex in the presence of a dye-forming coupler produces a photographic image in exposed regions. Also, if an element or composition not exposed in the presence of a coupler is subsequently treated with a dye-forming coupler, a photographic image forms in exposed regions. After production of the image, it can be stabilized by a water wash. If desired, the photographic image can be intensified by heating. Lithographic printing surfaces can be prepared when an element including a lithographic plate support has thereon a composition of the present type that is ink receptive or can be made so by exposure to activating rays. The lithographic surface is formed after exposure and subsequent washing away of exposed or unexposed regions.